(12) United States Patent
Converse

(10) Patent No.: US 8,015,830 B2
(45) Date of Patent: Sep. 13, 2011

(54) HEAT PUMP FOR HIGH TEMPERATURE ENVIRONMENTS

(75) Inventor: David G. Converse, Hampden, MA (US)

(73) Assignee: Hamilton Sundstrand Space Systems International, Inc., Windsor Locks, CT (US)

( * ) Notice: Subject to any disclaimer, the term of this patent is extended or adjusted under 35 U.S.C. 154(b) by 48 days.

(21) Appl. No.: 12/544,354

(22) Filed: Aug. 20, 2009

(65) Prior Publication Data

US 2011/0041516 A1 Feb. 24, 2011

(51) Int. Cl.
*F25B 21/02* (2006.01)
(52) U.S. Cl. .......................................... 62/3.3; 62/259.2
(58) Field of Classification Search ............ 62/3.2, 62/3.3, 3.6, 3.7, 259.2; 429/13, 26
See application file for complete search history.

(56) References Cited

U.S. PATENT DOCUMENTS

| | | | |
|---|---|---|---|
| 4,386,309 A * | 5/1983 | Peschka | 322/2 R |
| 5,753,383 A | 5/1998 | Cargnelli et al. | |
| 6,375,812 B1 | 4/2002 | Leonida | |
| 6,411,109 B1 | 6/2002 | Hanson | |
| 6,458,478 B1 | 10/2002 | Wang et al. | |
| 6,751,963 B2 * | 6/2004 | Navedo et al. | 62/6 |
| 6,951,114 B2 * | 10/2005 | Grisham et al. | 62/3.7 |
| 7,171,955 B2 * | 2/2007 | Perkins | 123/563 |
| 7,217,472 B2 | 5/2007 | Leonida | |
| 7,226,018 B2 | 6/2007 | Sullivan | |
| 7,237,748 B2 | 7/2007 | Sullivan | |
| 7,254,953 B2 * | 8/2007 | Callas et al. | 62/3.7 |
| 7,443,057 B2 | 10/2008 | Nunally | |
| 7,459,064 B2 | 12/2008 | Anderson | |
| 7,484,690 B2 | 2/2009 | D'Ausilio et al. | |
| 7,493,766 B2 | 2/2009 | Yang et al. | |
| 7,557,293 B2 | 7/2009 | Chou et al. | |
| 2007/0031713 A1 * | 2/2007 | Cho et al. | 429/26 |

* cited by examiner

*Primary Examiner* — Melvin Jones
(74) *Attorney, Agent, or Firm* — Carlson, Gaskey & Olds, PC

(57) ABSTRACT

A component has an outer wall defining an interior chamber to be cooled. Electronic equipment is mounted within the outer wall in the chamber. A thermoelectric cooler has a cool node positioned to be within the chamber, and a hot node positioned outwardly of the outer wall. A fuel cell provides electricity to the thermoelectric cooler. The fuel cell is mounted outwardly of the outer wall.

13 Claims, 1 Drawing Sheet

HEAT PUMP FOR HIGH TEMPERATURE ENVIRONMENTS

BACKGROUND OF THE INVENTION

This application relates to a heat pump for removing heat from an enclosed chamber that will be utilized in an extremely high temperature environment.

More and more electronic equipment must survive in very high temperature situations. As one example, probes are being considered for use in studying other planets. One particular probe is considered for use on the planet Venus.

A probe utilized on the planet Venus must survive extreme ambient conditions. As an example, the ambient conditions may be on the order of 500° centigrade, and pressures of 92 atmospheres.

On the other hand, the electronics and components within the probe must be maintained at a working temperature such that they can continue to operate effectively. As an example, temperatures more on the order of 25° centigrade would be desirable.

Further complicating this challenge is a goal that the cooling of the components not require additional weight or complex componentry.

SUMMARY OF THE INVENTION

A system has an outer wall defining an interior chamber to be cooled. Electronic equipment is mounted within the outer wall in the chamber. A thermoelectric cooler has a cool node positioned to be within the chamber, and a hot node positioned outwardly of the outer wall. A fuel cell provides electricity to the thermoelectric cooler. The fuel cell is mounted outwardly of the outer wall.

These and other features of the present invention can be best understood from the following specification and drawings, the following of which is a brief description.

DETAILED DESCRIPTION OF THE PREFERRED EMBODIMENT

Figure 1:
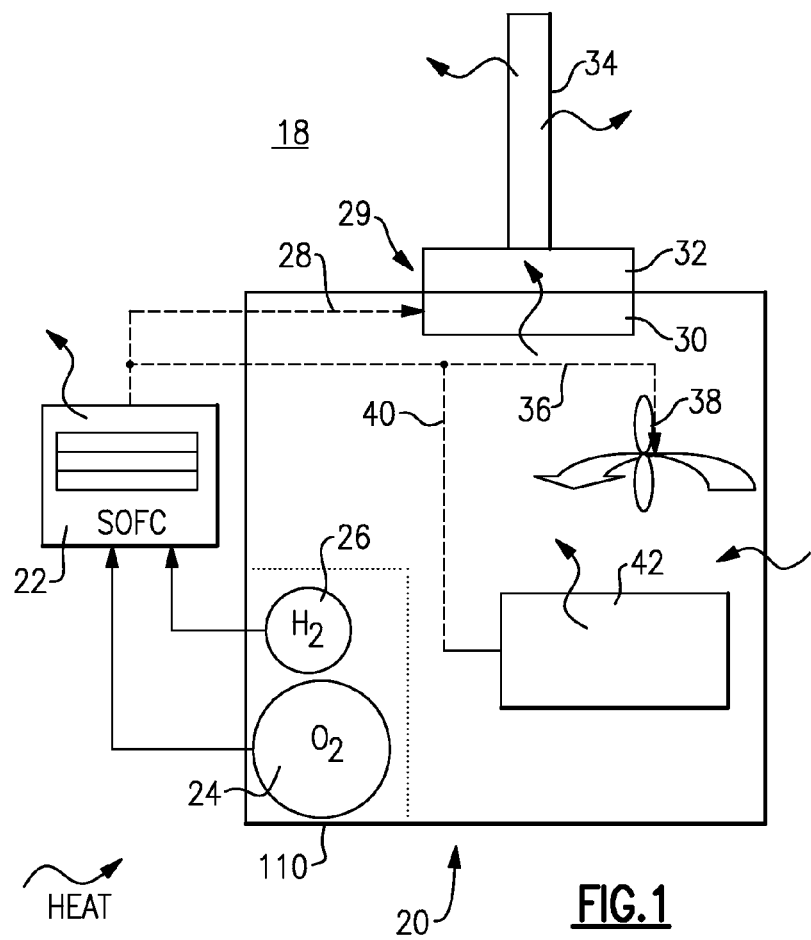
FIG. 1 shows a first embodiment of the present invention.

FIG. 1 shows a probe 20 which may be utilized in outer space applications, or other applications wherein the ambient environment 18 is extremely challenging. As an example, if utilized as a probe on the planet Venus, the probe 20 must survive temperatures on the order of 500° centigrade.

The embodiment 20 includes a fuel cell 22, which may be a solid oxide fuel cell. As can be appreciated, the solid oxide fuel cell 22 is outside of an outer wall 110 of the probe 20. This is beneficial since the fuel cell will typically operate at 600° to 1000° centigrade. The heat generated by the fuel cell 22 will thus move into the ambient environment 18, and will not further complicate the cooling of the interior of the probe 20.

The fuel cell 22 is supplied with fuel sources such as hydrogen 26 and oxygen at 24. While a particular fuel cell type is disclosed, other type fuel cells may be utilized.

The fuel cell provides electricity to several components within the outer wall 110 including an electric line 36 powering a fan 38. The fan 38 pulls air over electronic equipment 42 which is to be cooled. The electronic equipment 42 may also be supplied with electricity from the fuel cell 22 through a line 40.

The cooling of the air driven by the fan 38 is accomplished by a thermoelectric cooler 29. Thermoelectric cooler is provided with electricity from fuel cell 22 by a line 28. As known, a thermoelectric cooler has a hot node and a cool node. As known, when electrical current is applied in one direction, heat is driven from one node to the other. As shown, the direction of current induces heat to flow from the cool node 30 to the hot node 32. Thus, as the air from the fan 38 passes over the cool node 30, the air is cooled, and heat removed from the air passes to the hot node 32. The hot node 32 is connected to a heat rejection device 34, and such that the heat will transmit into the ambient environment 18. The heat rejection device could be a radiator or a heat exchanger that would exchange heat with the ambient environment via convection.

The heat rejected to ambient includes heat generated in probe 20 and ambient heat that may leak into the probe.

Figure 2:
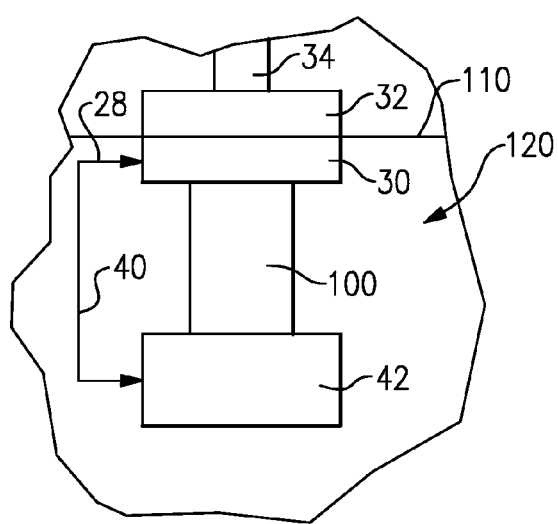
FIG. 2 shows a second embodiment of the present invention.

In a second embodiment 120 shown in FIG. 2, the fan 38 is replaced by a heat transfer element 100. The heat transfer element 100 could be any element which has good heat transfer characteristics and will remove heat directly from electronic equipment 42 and transmit heat to the cool node 30.

The thermoelectric cooler hot node 32 must operate at temperatures above the ambient conditions for the heat to transmit outwardly.

As shown, the hot node 32 is positioned outwardly of the outer wall 110 while the cool node 30 is positioned inwardly. In practice, the outer wall need not be at the exact dividing point of the two, however, the cool node should be largely within an inner surface of the outer wall 110, while the hot node is largely outside of the outer wall 110. Thus, the term in the claim "outside the outer wall" as utilized with regard to the hot node should be interpreted to mean the majority of the hot node is positioned outwardly of an inner surface of the outer wall.

The instrumentation 42 would typically be mounted within a housing, and this should be considered when interpreting the cooling of the electronic equipment for either the FIG. 1 or the FIG. 2 embodiment.

While the fuel cell 22 is shown separate from the outer wall 110, the two would be connected in the system. Some way of connecting the two together, either with additional framework for a probe, as an example, or by some direct connection would typically be utilized.

The use of the thermoelectric cooler provides a reliable component that will have long life, given its lack of moving parts and the fact that it is well developed technology. In addition, the fuel cell and the thermoelectric cooler are both very lightweight components.

The fuel cell can also provide electricity to other components that may be associated with the spacecraft.

While this specific disclosure has been directed to a spacecraft, other applications wherein a very high environment or ambient environment may be encountered may also benefit from these systems.

Although embodiments of this invention have been disclosed, a worker of ordinary skill in this art would recognize that certain modifications would come within the scope of this invention. For that reason, the following claims should be studied to determine the true scope and content of this invention.

What is claimed is:
1. A system comprising:
an outer wall defining an interior chamber to be cooled;
electronic equipment mounted within said outer wall;

a thermoelectric cooler, said thermoelectric cooler having a cool node positioned within said outer wall, and a hot node to be positioned outwardly of said outer wall; and a fuel cell providing electricity to said thermoelectric cooler, and said fuel cell being mounted outwardly of said outer wall.

2. The system as set forth in claim 1, wherein said fuel cell is a solid oxide fuel cell.

3. The system as set forth in claim 2, wherein a fuel source for said fuel cell is mounted within said outer wall.

4. The system as set forth in claim 3, wherein said fuel source includes both a hydrogen and an oxygen fuel source.

5. The system as set forth in claim 1, wherein said hot node of said thermoelectric cooler connects to a heat rejection device to transmit heat outwardly into a surrounding environment.

6. The system as set forth in claim 1, wherein a fan pulls air over said electronic equipment, and passes the air to said cool node of said thermoelectric cooler.

7. The system as set forth in claim 1, wherein a solid component having good heat transfer characteristics connects said electronic equipment to said cool node.

8. The system as set forth in claim 1, wherein said system is utilized as a probe for outer space application.

9. A system comprising:

an outer wall defining an interior chamber to be cooled;

electronic equipment mounted within said outer wall;

a thermoelectric cooler, said thermoelectric cooler having a cool node positioned within said outer wall, and a hot node to be positioned outwardly of said outer wall; and a fuel cell providing electricity to said thermoelectric cooler, and said fuel cell being mounted outwardly of said outer wall, said fuel cell being a solid oxide fuel cell;

fuel sources for said fuel cell include both a hydrogen and an oxygen fuel source wherein said hot node of said thermoelectric cooler connects to a heat rejection device to transmit heat outwardly into the environment.

10. The system as set forth in claim 9, wherein a fan pulls air over said electronic equipment, and passes the air to said cool node of said thermoelectric cooler.

11. The system as set forth in claim 9, wherein a solid component having good heat transfer characteristics connects said electronic equipment to said cool node.

12. The system as set forth in claim 9, wherein said system is utilized as a probe for outer space application.

13. The system as set forth in claim 9, wherein said fuel sources are mounted within said outer wall.

* * * * *